United States Patent
Usuda et al.

(10) Patent No.: US 9,743,026 B2
(45) Date of Patent: Aug. 22, 2017

(54) SEMICONDUCTOR PHOTODETECTOR

(71) Applicant: Panasonic Intellectual Property Management Co., Ltd., Osaka (JP)

(72) Inventors: Manabu Usuda, Hyogo (JP); Yutaka Hirose, Kyoto (JP); Yoshihisa Kato, Shiga (JP); Nobukazu Teranishi, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 186 days.

(21) Appl. No.: 14/740,113

(22) Filed: Jun. 15, 2015

(65) Prior Publication Data

US 2015/0281620 A1    Oct. 1, 2015

Related U.S. Application Data

(63) Continuation of application No. PCT/JP2013/005833, filed on Oct. 1, 2013.

(30) Foreign Application Priority Data

Dec. 18, 2012 (JP) ................................. 2012-275383
Mar. 14, 2013 (JP) ................................. 2013-051330

(51) Int. Cl.
*H01L 27/146* (2006.01)
*H04N 5/378* (2011.01)
(Continued)

(52) U.S. Cl.
CPC ................ *H04N 5/378* (2013.01); *G01J 1/44* (2013.01); *H01L 27/14609* (2013.01);
(Continued)

(58) Field of Classification Search
CPC .......... H01L 27/1462; H01L 27/14629; H01L 27/1464
(Continued)

(56) References Cited

U.S. PATENT DOCUMENTS

| 5,596,186 A | 1/1997 | Kobayashi |
| 5,623,108 A | 4/1997 | Kosugi et al. |

(Continued)

FOREIGN PATENT DOCUMENTS

| JP | 5-145110 | 6/1993 |
| JP | 7-067043 | 3/1995 |

(Continued)

OTHER PUBLICATIONS

International Search Report of PCT application No. PCT/JP2013/005833 dated Nov. 19, 2013.

*Primary Examiner* — Kevin Pyo
(74) *Attorney, Agent, or Firm* — McDermott Will & Emery LLP

(57) ABSTRACT

A semiconductor photodetector has at least one unit pixel having a photoelectric conversion part, a charge storage part, and a detection circuit. The photoelectric conversion part includes a charge multiplication region in which incident light is converted into a charge, and the charge is multiplied by avalanche multiplication. The charge storage part is connected to the photoelectric conversion part and stores a signal charge from the photoelectric conversion part. The detection circuit is connected to the charge storage part, converts the signal charge stored in the charge storage part into a voltage, passes the voltage through an amplifier to amplify the voltage, and outputs the amplified voltage.

17 Claims, 18 Drawing Sheets

(51) Int. Cl.
  *H04N 5/369* (2011.01)
  *H04N 5/3745* (2011.01)
  *G01J 1/44* (2006.01)
  *H01L 31/107* (2006.01)
  *H04N 5/357* (2011.01)
  *H04N 5/361* (2011.01)

(52) U.S. Cl.
  CPC .. *H01L 27/14612* (2013.01); *H01L 27/14634* (2013.01); *H01L 27/14665* (2013.01); *H01L 31/107* (2013.01); *H04N 5/357* (2013.01); *H04N 5/361* (2013.01); *H04N 5/369* (2013.01); *H04N 5/37455* (2013.01); *H01L 27/14623* (2013.01)

(58) Field of Classification Search
  USPC .............. 250/214.1, 370.01, 370.08, 370.14; 257/460, 463, 464
  See application file for complete search history.

(56) References Cited

U.S. PATENT DOCUMENTS

| | | | |
|---|---|---|---|
| 5,767,560 | A | 6/1998 | Gofuku |
| 6,476,374 | B1 | 11/2002 | Kozlowski et al. |
| 6,483,116 | B1 | 11/2002 | Kozlowski et al. |
| 7,262,402 | B2 | 8/2007 | Niclass et al. |
| 9,496,308 | B2 * | 11/2016 | Haddad ............... H01L 27/1462 |
| 2005/0253132 | A1 | 11/2005 | Marshall et al. |
| 2006/0186560 | A1 | 8/2006 | Swain et al. |
| 2007/0235829 | A1 | 10/2007 | Levine et al. |
| 2009/0267121 | A1 | 10/2009 | Ishida et al. |
| 2010/0200944 | A1 | 8/2010 | Levine et al. |
| 2010/0327387 | A1 | 12/2010 | Kasai et al. |
| 2011/0095388 | A1 | 4/2011 | Richter et al. |
| 2011/0180688 | A1 | 7/2011 | Nakahara |
| 2011/0266599 | A1 | 11/2011 | Ishida et al. |
| 2011/0272561 | A1 | 11/2011 | Sanfilippo et al. |
| 2012/0190150 | A1 | 7/2012 | Levine et al. |
| 2012/0267746 | A1 | 10/2012 | Sanfilippo et al. |

FOREIGN PATENT DOCUMENTS

| | | |
|---|---|---|
| JP | 7-221341 | 8/1995 |
| JP | 2000-253320 | 9/2000 |
| JP | 2004-510352 | 4/2004 |
| JP | 2004-319576 | 11/2004 |
| JP | 2005-532695 | 10/2005 |
| JP | 2006-148828 | 6/2006 |
| JP | 2008-530801 | 8/2008 |
| JP | 2009-283896 | 12/2009 |
| JP | 2010-536165 | 11/2010 |
| JP | 2011-009749 | 1/2011 |
| JP | 2011-151271 | 8/2011 |
| JP | 2012-235265 | 11/2012 |

* cited by examiner

SEMICONDUCTOR PHOTODETECTOR

BACKGROUND OF THE INVENTION

1. Field of the Invention

The present disclosure relates to a semiconductor photodetector, and in particular relates to a semiconductor photodetector which detects very weak light.

2. Description of the Related Art

In recent years, in various fields such as medical services, biotechnology, and radiation measurement, there is required a photodetector which accurately measures light as weak as a single photon. Currently, a photomultiplier tube (PMT) is widely used for detecting weak light. However, the size of a PMT, which is a vacuum tube device, is about 10 mm×10 mm at smallest, and therefore it is difficult to increase the number of pixels. In addition, when a PMT is used to perform two-dimensional imaging, it is necessary to scan an object in an X-Y plane to gather information of every point of the object and then to form an image. Therefore, it is difficult to capture an image of the object in real time. In view of the above issues, in order to realize both of multiple pixels and high speed in a photodetector for detecting very weak light, a solid state device of the photodetector is required.

As an example of photodetectors for detecting very weak light, there is proposed a photon-counting type photodetector, in which an avalanche photo diode (APD) is used. This photodetector counts photons entering an APD and transmits the result of the counting as a signal of a digital value to the outside of the pixel.

For example, as described in PTL 1, a photon-counting type photodetector has a structure with a plurality of APDs arranged in a matrix, and each APD is connected to a load resistor and is applied with a high voltage slightly lower than a breakdown voltage or not lower than the breakdown voltage. In the photodetector, a pulse signal is generated in response to one photon entering the APD, based on an operation principle to be described below, and the pulse signal increments a count value of a counter by one. By this operation, the incident photons are counted.

In the following, an operation principle of the APD will be briefly described.

A photon entering the APD generates an electron-hole pair. One or both of the generated electron and hole are accelerated by an electric field in the APD generated depending on a voltage applied to the both ends of the APD, and collide with a crystal lattice to generate another electron-hole pair. This phenomenon is referred to as "impact ionization". This impact ionization is repeated, and the charges are thus multiplied.

The APD has two operation modes, i.e., a linear mode and a Geiger mode.

The linear mode is an operation mode in which the APD is applied with a voltage slightly lower than the breakdown voltage of the APD so that only one of the electron and the hole causes impact ionization. In the linear mode, impact ionization occurs a limited number of times, and therefore the output current is proportional to the number of the incident phones.

The Geiger mode is an operation mode in which the APD is applied with a voltage not lower than the breakdown voltage of the APD so that both of the electron and the hole cause impact ionization. In the Geiger mode, both of the electron and the hole repeat impact ionization in an avalanche manner, and the output current thus increases rapidly. Therefore, the device is usually used with a load resistor series-connected to the APD so that the device is not destroyed. In this case, if a large current flows through the load resistor, a voltage is generated on the both ends of the load resistor, and the voltage applied to the both ends of the APD is reduced by the generated voltage. When the voltage on the both ends of the APD becomes greatly lower than the breakdown voltage, the impact ionization stops, and the output current decreases rapidly. Thus, in the Geiger mode, the output current is a pulse signal, and the value of the current output from the APD is not proportional to the incident photon.

The photodetector described in PTL 1 uses an APD in the Geiger mode.

CITATION LIST

Patent Literature

PTL 1: U.S. Pat. No. 7,262,402

SUMMARY OF THE INVENTION

The APD multiplies not only the charge generated by the incoming photons but also the charge generated by causes other than the incoming photons, for example, thermal excitation; thus, a dark noise is generated. The conventional photon-counting type photodetector uses a Geiger mode APD having a high multiplication factor, and a dark noise of the photodetector is thus extremely high. Therefore, there is an issue that the difference between the signal due to the charge generated by the incident photons and the dark noise cannot be distinguished only by a single detection and that an S/N ratio given by the ratio of the signal (S) and the noise (N) is extremely low.

In addition, the current generated by the multiplication on the APD is due to a random phenomenon in which the current is generated in the process of the charge colliding the crystal lattice, and thus there is generated a multiplication noise caused by a shot noise. Because the Geiger mode APD operates with a high multiplication factor (usually, $10^5$ times or higher), the multiplication noise is greater by an amount corresponding to the multiplication factor.

In the Geiger mode APD, data are integrated for the number of times of sampling, on a detection circuit, synchronized with a light source; thus, the S/N ratio can be improved compared to the detection of the data by a single detection. However, because, in this method, it is necessary to synchronize the timing of signal detection with a light emission timing of a light source, the method cannot be used for detection of random light, for example, radiation measurement. In order to enable the detection of random light, it is necessary to reduce the generation of a dark current of the device, which is a random noise, as small as possible.

In view of the above problems, the present disclosure provides a semiconductor photodetector which can detect very weak light containing random light, by greatly reducing the dark noise and the multiplication noise compared to conventional photodetectors.

In order to solve the above problems, a semiconductor photodetector according to an aspect of the present disclosure includes at least a unit pixel, and the unit pixel includes a photoelectric conversion part, a charge storage part, and a detection circuit. The photoelectric conversion part includes a charge multiplication region in which incident light is converted into a charge, and the charge is multiplied by avalanche multiplication. The charge storage part is connected to the photoelectric conversion part and stores a signal charge from the photoelectric conversion part. The detection circuit is connected to the charge storage part, converts the signal charge stored in the charge storage part into a voltage, passes the voltage through an amplifier to amplify, and outputs the amplified voltage.

According to the present disclosure, the multiplication noise and the dark current noise can be as small as possible, and thus it is possible to realize a semiconductor photodetector in which very weak light containing random light can be detected.

DETAILED DESCRIPTION OF THE PREFERRED EMBODIMENTS

In the following, an exemplary embodiment according to the present disclosure will be specifically described with reference to the drawings. Substantially the same components are assigned the same referential numerals and are not described, in some cases. It should be understood that the present disclosure is not limited to the following exemplary embodiments. It is possible to combine configurations according to different exemplary embodiments together if there is no technical contradiction.

First Exemplary Embodiment

Figure 1:
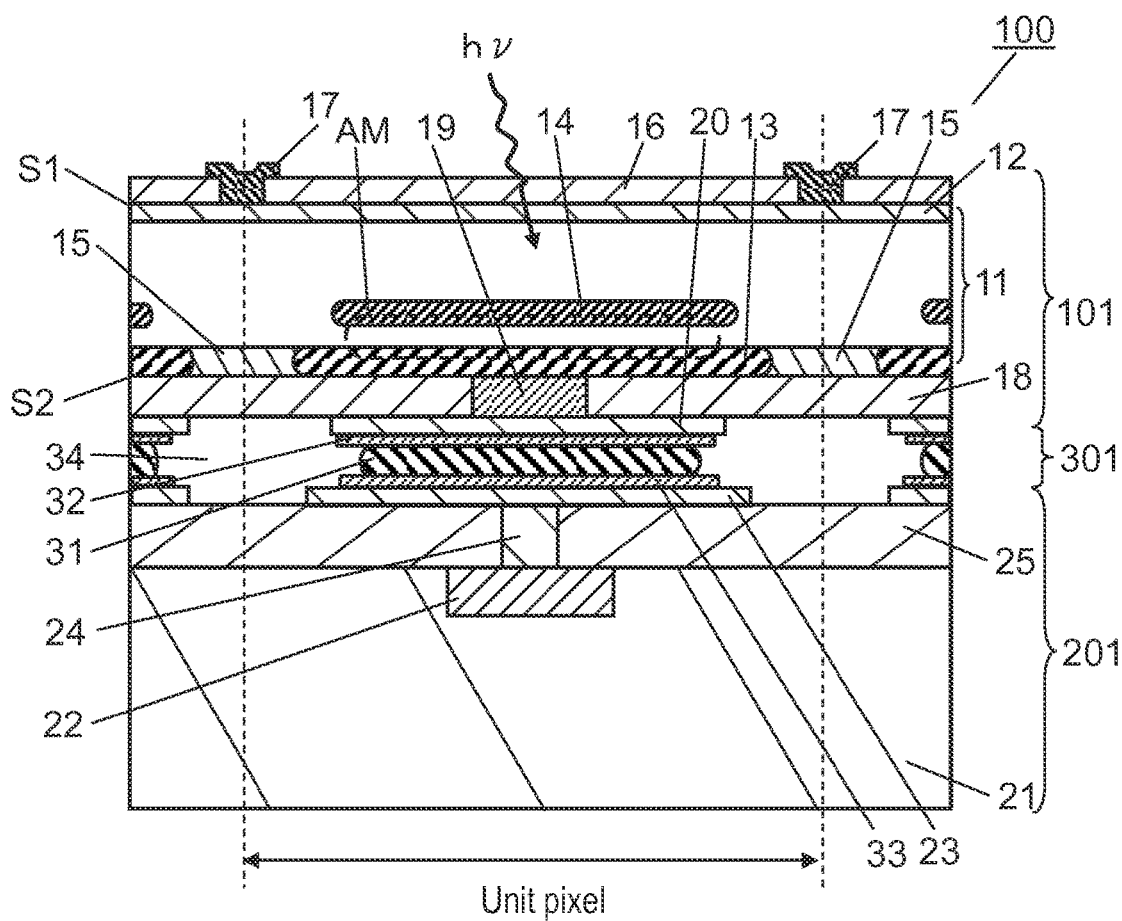
FIG. 1 is a sectional view of a unit pixel of a semiconductor photodetector according to a first exemplary embodiment of the present disclosure.
Figure 2:
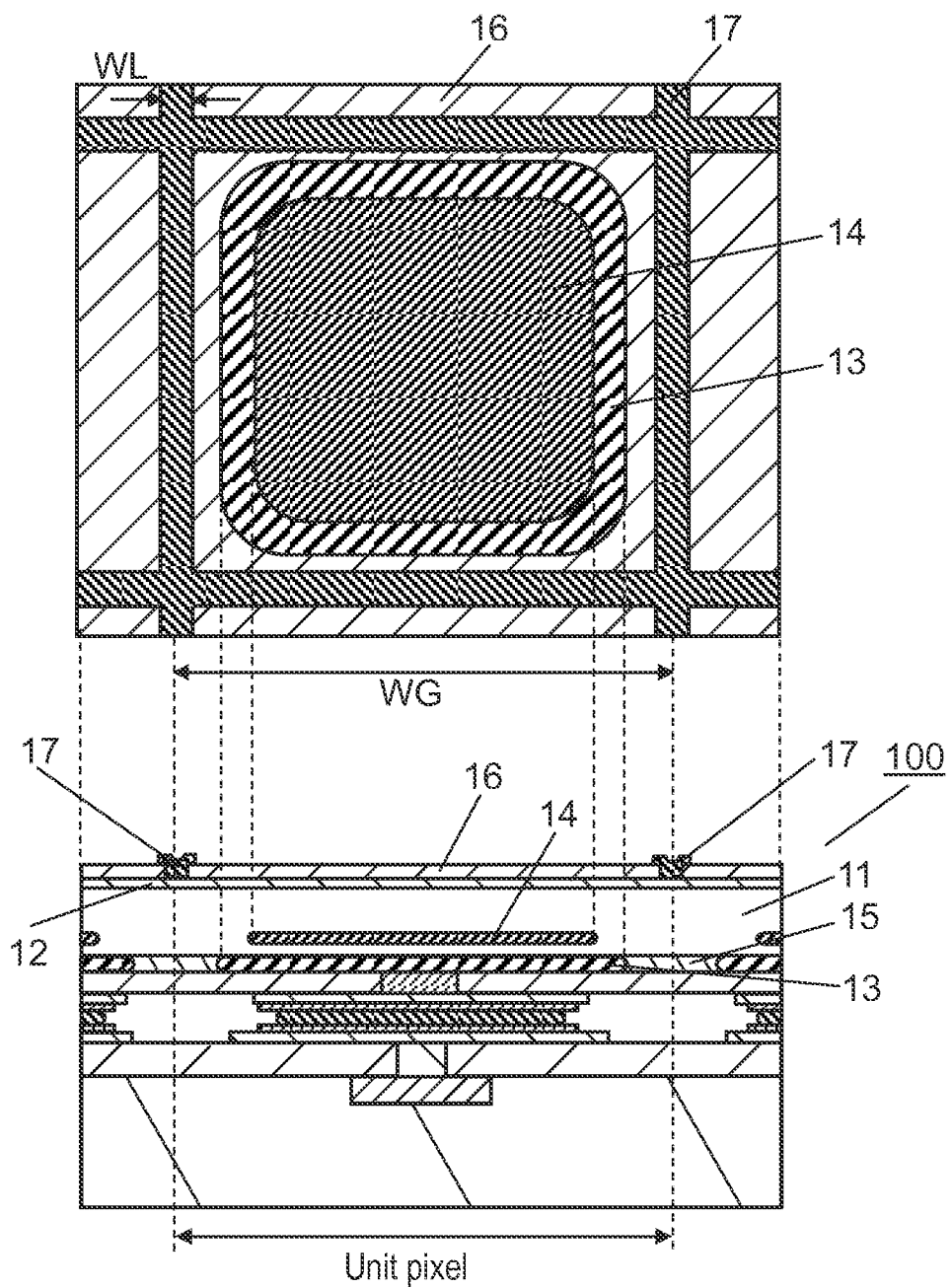
FIG. 2 is a diagram showing a relationship between a sectional view and a plan view (partial transparent view) of the unit pixel of the semiconductor photodetector according to the first exemplary embodiment.

First, with reference to FIG. 1 and FIG. 2, there will be described a structure of a unit pixel of a semiconductor photodetector according to a first exemplary embodiment of the present disclosure. FIG. 2 is a partial transparent drawing for clearly illustrating an arrangement, in a planar view, in the semiconductor photodetector according to the present exemplary embodiment. Note that the term "planar view" in the present detailed description represents the view from the normal line direction of a light receiving surface of photoelectric conversion part 101.

Semiconductor photodetector 100 according to the present exemplary embodiment has a plurality of unit pixels arranged, in a matrix, on semiconductor substrate 21. Each of the plurality of unit pixels has photoelectric conversion part 101 and detection circuit 201, and photoelectric conversion part 101 and detection circuit 201 are electrically connected through bonding part 301.

First, photoelectric conversion part 101 will be described.

Photoelectric conversion part 101 has a p$^-$-type semiconductor layer 11 having first surface S1 on the side from which incident light enters and having second surface S2 opposite to first surface S1. Photoelectric conversion part 101 further has, in semiconductor layer 11, p$^+$-type first semiconductor part 12, n$^+$-type second semiconductor part 13, p$^-$-type third semiconductor part 14, and n$^-$-type fourth semiconductor part 15. P-type is referred to as a first conductive type, and n-type is referred to as a second conductive type.

First semiconductor part 12 is disposed on first surface S1 side of semiconductor layer 11 and constitutes an anode. First semiconductor part 12 is formed on an entire surface of first surface S1 and formed over the plurality of unit pixels.

Second semiconductor part 13 is disposed on a part on second surface S2 side of semiconductor layer 11 and constitutes a cathode. Second semiconductor part 13 is formed in each unit pixel, and second semiconductor parts 13 in the adjoining unit pixels are isolated from each other.

Third semiconductor part 14 is disposed inside semiconductor layer 11 so as to overlap second semiconductor part 13 in a planar view. Third semiconductor part 14 is formed in each unit pixel, and third semiconductor parts 14 in the adjoining unit pixels are isolated from each other. In the present exemplary embodiment, second semiconductor parts 13 are formed larger than third semiconductor parts 14 in a planar view. This arrangement reduces a signal leaking into the neighboring unit pixels.

Fourth semiconductor part 15 is formed on second surface S2 side and in an area in which second semiconductor part 13 is not disposed. Fourth semiconductor part 15 is to isolate second semiconductor parts 13 in the adjoining unit pixels from each other.

Photoelectric conversion part 101 further has protective oxide film 16, electrode 17 (referred to as a first electrode), interlayer insulating film 18, first contact plug 19, and first pixel electrode 20.

Protective oxide film 16 is disposed on a surface, of first semiconductor part 12, on the side from which incident light enters. In other words, protective oxide film 16 is disposed on first surface S1 of semiconductor layer 11.

Electrode 17 is disposed in an area, in which protective oxide film 16 is not disposed, on first surface S1. Electrode 17 is electrically connected to first semiconductor part 12 and is disposed in a grid-like manner so as to divide protective oxide film 16 for each pixel.

Interlayer insulating film 18 is disposed in contact with second semiconductor part 13 and fourth semiconductor part 15. In other words, interlayer insulating film 18 is disposed on second surface S2 of semiconductor layer 11. First pixel electrode 20 (referred to as a "second electrode") is disposed on interlayer insulating film 18 and is electrically connected to second semiconductor part 13 through first contact plug 19 disposed in interlayer insulating film 18. First pixel electrode 20 and first contact plug 19 are formed in each unit pixel.

Fourth semiconductor part 15 functions as a pixel isolation region for isolating the adjoining unit pixels. In other words, fourth semiconductor part 15 isolates adjoining second semiconductor parts 13. As a modified example of the present exemplary embodiment, an insulator may be provided as a substitute for fourth semiconductor part 15. In that case, it may be possible to use, as the insulator, a shallow trench isolation (STI) or the like which is used for CMOS LSIs, for example.

As a modified example of the present exemplary embodiment, it may be possible to realize the pixel isolation by forming fourth semiconductor part 15 of a conductive type different from the conductive type of second semiconductor part 13. Specifically, the conductive type of fourth semiconductor part 15 may be p-type or p$^-$-type.

Electrode 17 is made of metal containing mainly any of aluminum (Al), cupper (Cu), and titanium (Ti), for example. First contact plug 19 is made of metal containing tungsten (W), for example.

First semiconductor part 12 has an impurity concentration higher than an impurity concentration of third semiconductor part 14. Third semiconductor part 14 has the impurity concentration higher than an impurity concentration of semiconductor layer 11. With this configuration, avalanche multiplication area (charge multiplication region) AM can be selectively formed only in an effective area in the unit pixel; thus, it is possible to multiply only the necessary charge. Specifically, charge multiplication region AM is formed between third semiconductor part 14 and second semiconductor part 13.

Next, detection circuit 201 will be described.

Detection circuit 201 has p-type semiconductor substrate 21, n$^-$-type charge storage part 22, second pixel electrode 23, second contact plug 24, and inter-wiring-layer film 25. Charge storage part 22 is disposed in p-type semiconductor substrate 21 and stores a signal charge from photoelectric conversion part 101. Inter-wiring-layer film 25 is disposed on a surface, of semiconductor substrate 21, on the side of photoelectric conversion part 101. Second pixel electrode 23 is disposed on a surface, of inter-wiring-layer film 25, on the side of photoelectric conversion part 101. Second contact plug 24 is disposed in inter-wiring-layer film 25 and electrically connects charge storage part 22 and second pixel electrode 23. Inter-wiring-layer film 25 is made of an insulating film. Detection circuit 201 has a detection circuit constituted of reset circuit 60 and amplifier 50 (not shown in FIG. 1 or FIG. 2) to be later described.

Second pixel electrode 23 is made of metal containing mainly Al, Cu, and Ti, for example; and second contact plug 24 is made of metal containing mainly W, for example. With reference to FIG. 1, a surface, of charge storage part 22, on the side of photoelectric conversion part 101 is on the same plane as a surface, of semiconductor substrate 21, on the side of photoelectric conversion part 101. Alternatively, charge storage part 22 may be buried inside semiconductor substrate 21 so that charge storage part 22 is not in contact with inter-wiring-layer film 25. In this case, a dark current to be generated on an interface between inter-wiring-layer film 25 and charge storage part 22 is reduced. As a method for burying charge storage part 22 inside semiconductor substrate 21, an impurity (p-type impurity in the present exemplary embodiment) of the conductive type opposite to the conductive type of an impurity to be implanted in charge storage part 22 is implanted in the surface, of semiconductor substrate 21, other than an area in which charge storage part 22 is in contact with second contact plug 24. Further, second semiconductor part 13 of photoelectric conversion part 101 is disposed so as to overlap second pixel electrode 23 in a planar view.

Next, bonding part 301 will be described.

Bonding part 301 electrically connects photoelectric conversion part 101 and detection circuit 201. Bonding part 301 has bonding bump metal 31, first bonding base metal 32 on the side of photoelectric conversion part 101, and second bonding base metal 33 on the side of detection circuit 201. Bonding bump metal 31 is made of an alloy of tin (Sn) and silver (Ag), for example. The alloy has a low melting point of 220° C. or lower, and therefore it is possible to bond photoelectric conversion part 101 and detection circuit 201 at a low temperature. Thus, any of photoelectric conversion part 101 and detection circuit 201 is not likely to be adversely affected by the temperature. Alternatively, bonding bump metal 31 may be made of an alloy containing Au. Since it is easy to form narrow pitch bumps with the alloy by a plating method, a vapor deposition method, or other methods, the alloy is suitable to bond photoelectric conversion part 101 having narrow pitch pixel array and detection circuit 201.

A space surrounded by photoelectric conversion part 101, detection circuit 201, and bonding part 301 is filled with resin 34. In the case that the space is filled with resin 34, a strength of semiconductor photodetector 100 is higher than in the case that the space is not filled. However, the space does not need to be filled with resin 34 or other materials.

Next, it will be described how semiconductor photodetector 100 reads out incident light.

When an electric field intensity in an area sandwiched between second semiconductor part 13 and third semiconductor part 14 is equal to a predetermined value or higher, charge multiplication region AM is created. This predetermined value depends on a material of semiconductor layer 11, a distance between second semiconductor part 13 and third semiconductor part 14, and a voltage applied to the APD. For example, in the case that the material of semiconductor layer 11 is silicon and the distance is about 0.5 μm if a voltage of 20 V is applied to electrode 17, the electric field intensity in charge multiplication region AM is approximately $4 \times 10^5$ V/cm. This predetermined value is slightly lower than the breakdown voltage, and the APD operates in the linear mode; and with this electric field intensity, only electrons cause the avalanche multiplication.

An incident photon hυ from above photoelectric conversion part 101 goes through protective oxide film 16 and first semiconductor part 12, reaches semiconductor layer 11, and is absorbed in semiconductor layer 11 to generate a charge (electron-hole pair). The electron of the generated charge moves to charge multiplication region AM and causes the avalanche multiplication. The electrons generated by multiplication are output to the side of detection circuit 201 through second semiconductor part 13. On the other hand, the hole of the generated charge is not multiplied and is discharged through electrode 17.

As described above, the charge to be multiplied in charge multiplication region AM is only the electron in the present exemplary embodiment; and the hole moves in the opposite direction of the electron, which is to be the signal charge, and is not multiplied. Therefore, a temporal and spatial variation of electron-hole pairs newly generated by charges colliding with the crystal lattice is reduced, whereby a multiplication noise is reduced. Also in the case that the conductive types are reversed and only the hole of the charge is multiplied, the multiplication noise can be similarly reduced.

Third semiconductor part 14 is disposed so as not to overlap fourth semiconductor part 15 in a planar view. This configuration prevents charge multiplication region AM from being created in the pixel isolation region, thereby controlling the multiplication of the dark current at the interface between fourth semiconductor part 15 and interlayer insulating film 18.

The electron, which is generated at the interface between second semiconductor part 13 and interlayer insulating film 18 and at the interface between fourth semiconductor part 15 and interlayer insulating film 18 and which causes the dark current, moves to charge storage part 22 without being multiplied in charge multiplication region AM and is then periodically discharged by a reset pulse signal output from reset circuit 60 to be later described.

The hole, which is generated at the interface between second semiconductor part 13 and interlayer insulating film 18 and which causes the dark current, recombines with an electron which is the majority carrier in second semiconductor part 13 and is thus annihilated. In addition, the hole, which is generated at the interface between fourth semiconductor part 15 and interlayer insulating film 18 and which causes the dark current, is discharged through electrode 17 without being multiplied. As a result, the electron and the hole which cause the dark current are annihilated or discharged without being multiplied, whereby a noise is reduced.

Note that the present exemplary embodiment employs a so-called electron read-out method in which an electron of an electron-hole pair generated in photoelectric conversion part 101 is read out as a signal charge. However, if, in the present exemplary embodiment, the p-type is replaced by n-type, and the n-type is replaced by p-type, it is also possible to employ a so-called hole read-out method in which holes are read out as the signal charge.

As shown in FIG. 2, electrode 17 is disposed in a grid-like manner on a surface, of first semiconductor part 12, where incident light enters. Thus, electrode 17 can supply an external power supply voltage to the entire pixel area without preventing light from entering. In the case that a line width of electrode 17 is WL and a side of the unit pixel in a planar view is WG, if the relationship $1/30 \le WL/WG \le 1/5$ is satisfied, for example, a sufficient external power supply voltage can be supplied to the entire pixel area while a sufficient light receiving amount is secured. For example, when the equation $WL/WG=1/10$ is satisfied, an aperture ratio for a unit pixel is 81%, whereby a sufficient light receiving amount is obtained. If electrode 17 is made of a light-shielding material, electrode 17 has a light-shielding function, whereby color mixture between the adjoining unit pixels can be reduced.

Alternatively, electrode 17 may be disposed on the entire surface, of photoelectric conversion part 101, on an incident light side. In that case, a transparent conductive film is used for electrode 17, and protective oxide film 16 is not necessary. The transparent conductive film is made of ITO (Indium Tin Oxide), for example.

With these configurations, the external power supply voltage can be supplied to the entire pixel area without preventing light from entering.

Figure 3:
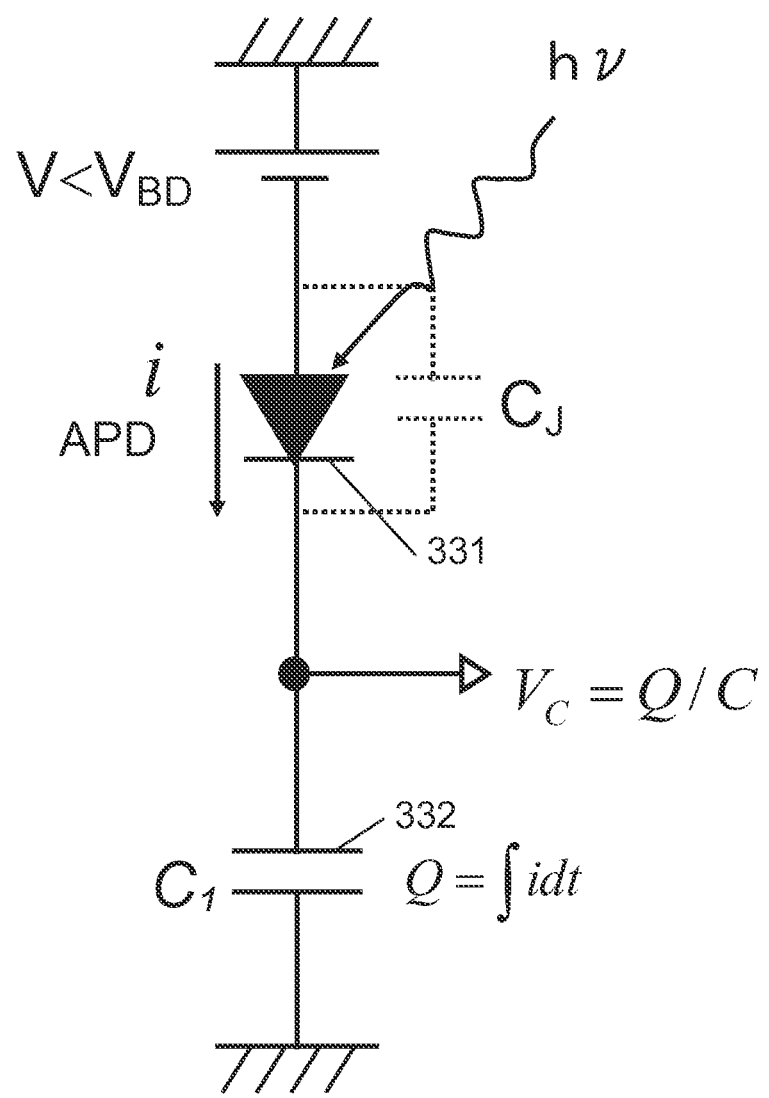
FIG. 3 is a diagram showing an equivalent circuit of the semiconductor photodetector according to the first exemplary embodiment.

Next, with reference to FIG. 3, it will be described how semiconductor photodetector 100 according to the present exemplary embodiment detects the signal. FIG. 3 is an equivalent circuit diagram of semiconductor photodetector 100 according to the present exemplary embodiment. With reference to FIG. 3, APD 331 and charge storage part 332 correspond to photoelectric conversion part 101 and charge storage part 22 of FIG. 1, respectively.

When light enters APD 331, a signal charge is generated inside APD 331, and a multiplication current i flows in accordance with the signal charge. In charge storage part 22, there is accumulated a charge $Q=\int i dt$. The increased signal charge Q is detected as a voltage change amount $V_c=Q/C$ expressed with a capacitance C of charge storage part 22. When charge storage part 22 having a small capacitance C is fabricated by a microfabrication technique, the voltage change amount $V_c$ can be made large.

For example, when a unit pixel size of semiconductor photodetector 100 is 25 μm×25 μm, and a size and a thickness (a length of a side perpendicular to the light receiving surface of photoelectric conversion part 101) of charge storage part 22 are 10 μm×10 μm and 1 μm, respectively, the capacitance $C_1$ of the capacitor is approximately 10 fF. In an operation of the linear mode, in which a voltage lower than a breakdown voltage $V_{BD}$ is used to drive, if the multiplication factor of the APD is assumed to be 100 times, a single photon enters to generate a signal charge, and the signal charge is then multiplied to make an electric charge amount of $Q=1.6\times 10^{-17}$ [C]. Thus, the voltage change amount in charge storage part 22 is output to be $V_c=Q/C_1=1.6$ [mV], which is a detectable value. By detecting the signal charge Q from the APD with the detection circuit of a capacitive load type, it is possible to detect very weak light even if the drive voltage is lower than the drive voltage used for the APD which operates in the Geiger mode shown in PTL 1, whereby the dark noise and the multiplication noise are largely reduced.

Figure 4:
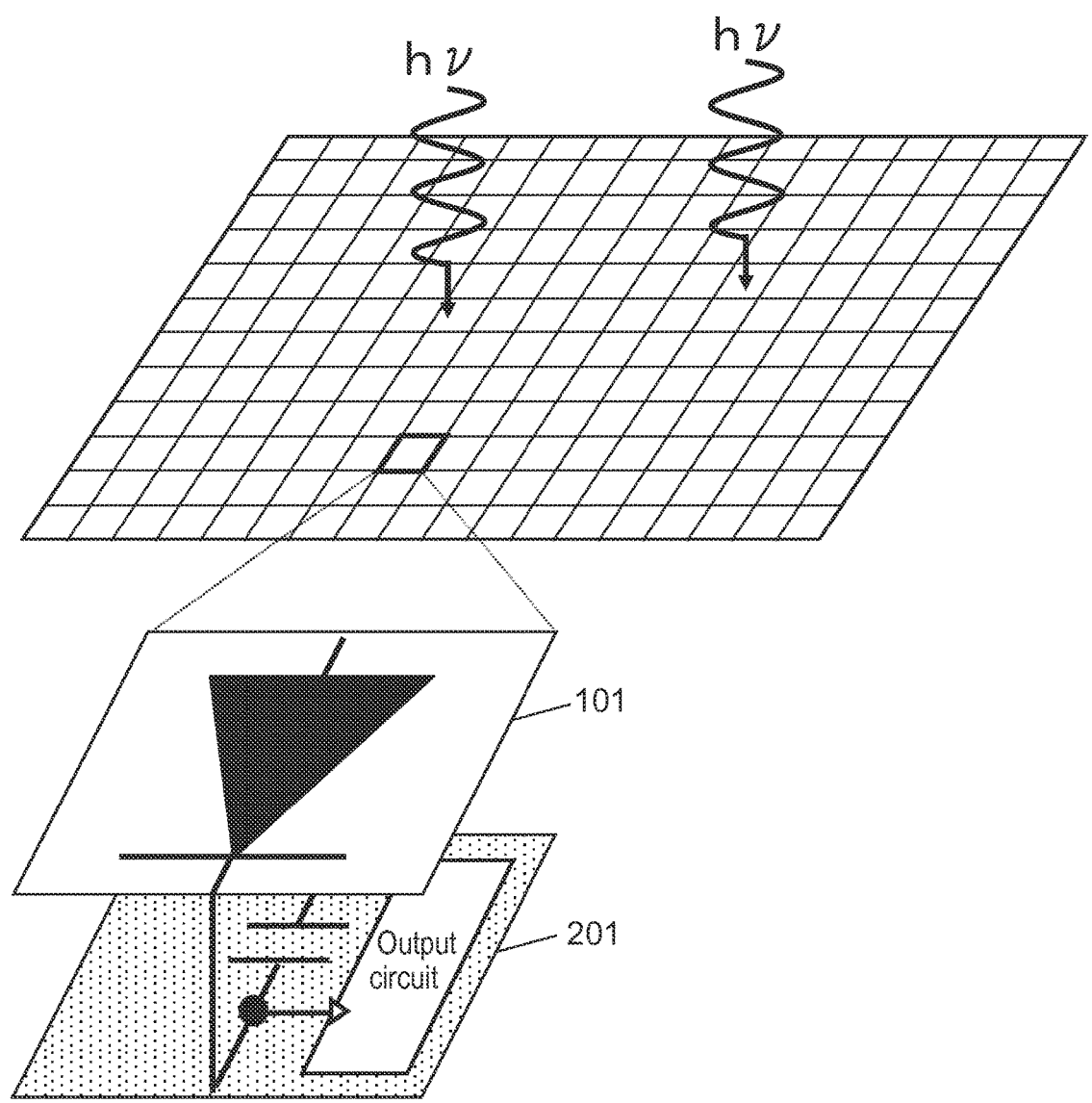
FIG. 4 is a conceptual diagram of integration of the photodetector according to the first exemplary embodiment.

Next, with reference to FIG. 4, it will be described how to integrate semiconductor photo detector 100 according to the present exemplary embodiment. As shown in FIG. 4, in semiconductor photodetector 100 according to the present exemplary embodiment, photoelectric conversion part 101 and detection circuit 201 are disposed in different layers. Specifically, there are arranged, in a matrix, unit pixels each having a structure in which photoelectric conversion part 101 is stacked on detection circuit 201. With this configuration, the charge storage part and an output circuit contained in detection circuit 201 do not need to be disposed outside the pixel area; therefore, an area of the pixel area can be large. In other words, since the detection circuit 201 is stacked on photoelectric conversion part 101, an area of semiconductor photodetector 100 can be smaller than that in the case that detection circuit 201 and photoelectric conversion part 101 are located on the same plane.

In addition, by integrating light detection data of the adjoining plurality of unit pixels, the signals (S) and the levels of noise (N) are each averaged, whereby the S/N ratio can be relatively compensated. Therefore, it is not necessary to perform a process in which the S/N ratio is compensated in synchronism with a light source, which process is performed in the conventional art in which scan is performed by using a single photodetector. That is, semiconductor photodetector 100 according to the present exemplary embodiment can realize also detection of random light.

Figure 5:
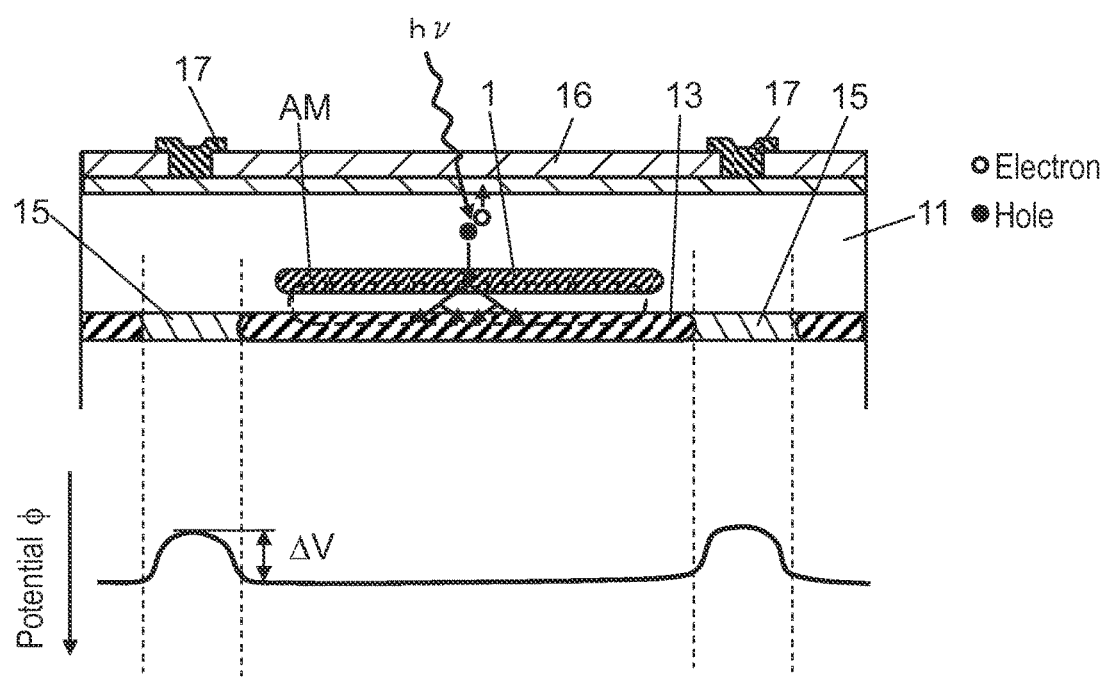
FIG. 5 is a diagram showing a shape of potential of pixel isolation according to the first exemplary embodiment.

Next, with reference to FIG. 5, there will be described a shape of potential of pixel isolation of semiconductor photodetector 100 according to the present exemplary embodiment. As shown in FIG. 5, in the present exemplary embodiment, the pixel isolation is realized by using a potential difference between second semiconductor part 13 and fourth semiconductor part 15. An impurity concentration of second semiconductor part 13 is preferably not less than 10 times and not more than $10^4$ times of the impurity concentration of fourth semiconductor part 15. The impurity concentration of second semiconductor part 13 is more preferably not less than $10^2$ times and not more than $10^3$ times of the impurity concentration of fourth semiconductor part 15.

For example, when the $n^+$ type impurity concentration of second semiconductor part 13 is assumed to be $10^{19}$ [/cm$^3$] and when the $n^-$-type impurity concentration of fourth semiconductor part 15 is assumed to be $10^{17}$ [/cm$^3$], the potential difference is $\Delta V=kT \ln(n^+/n^-)=120$ [mV] at the room temperature. Here, k is Boltzmann constant, and T is temperature. Meanwhile, when the number of the photons entering the unit pixel is assumed to be 1 photon/frame, and when the multiplication factor of the APD is assumed to be 100 times, the signal charge Q after multiplication is $Q=1.6 \times 10^{-17}$ [C]. When the junction capacitance $C_J$ of the APD is assumed to be 10 fF, the voltage change caused by the signal charge Q is $V_c=Q/C_J=1.6$ [mV]; thus the voltage change $V_c$ due to the signal charge Q is sufficiently smaller than a potential barrier. Therefore, the signal charge Q does not get over the potential barrier and does not leak into the neighboring unit pixels, whereby color mixture is prevented from occurring.

In the case that second semiconductor part 13 and fourth semiconductor part 15 have different conductive types, second semiconductor part 13 may be $n^+$ type and have the impurity concentration of $10^{19}$ [/cm$^3$] in the same manner as the above exemplary embodiment, and fourth semiconductor part 15 may be p-type and have the impurity concentration of $10^{17}$ [/cm$^3$], for example.

Next with reference to FIG. 6 to FIG. 11, there will be described a detection circuit of semiconductor photodetector 100 according to the present exemplary embodiment.

Figure 6:
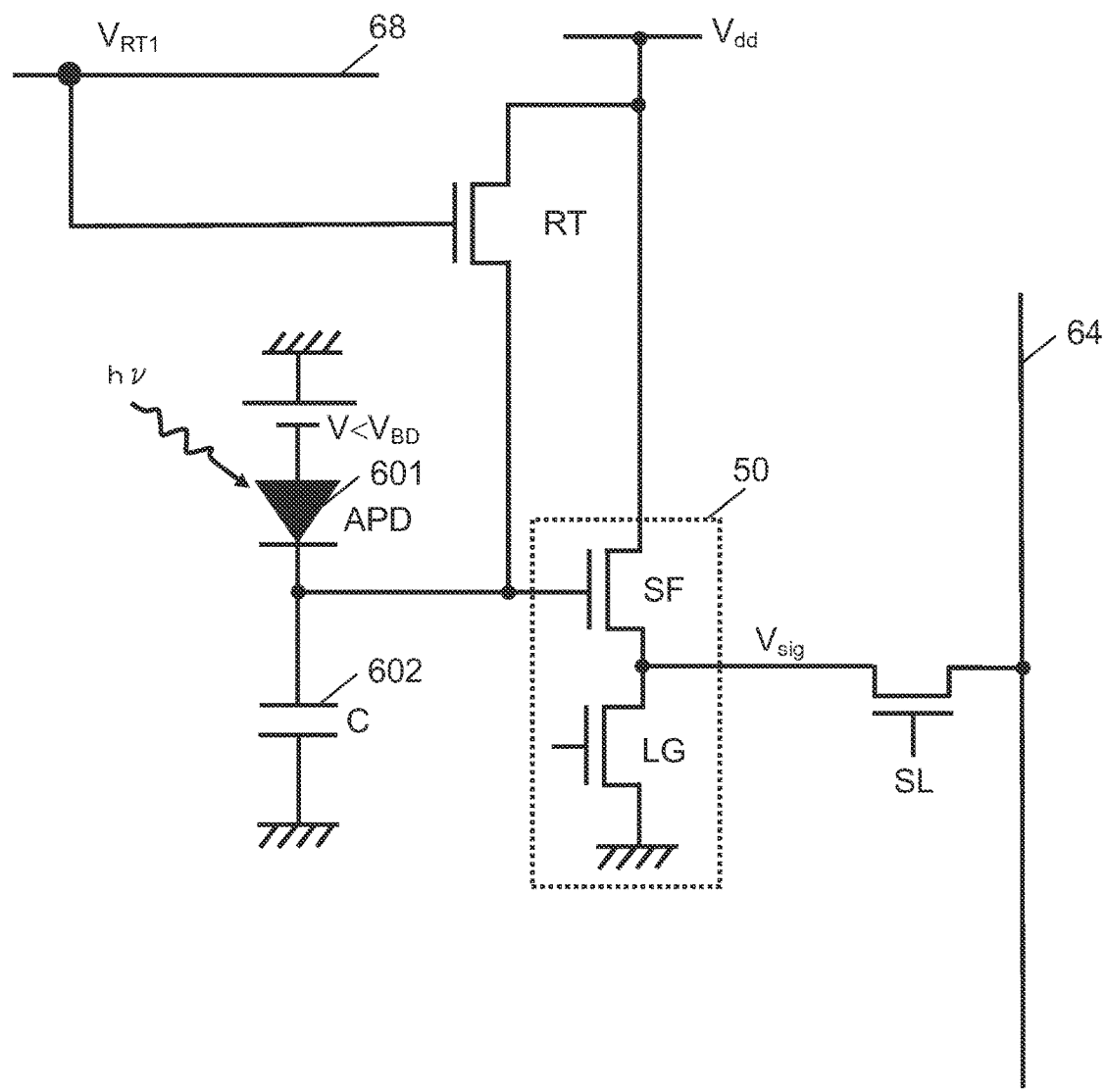
FIG. 6 is a circuit diagram showing a configuration example of a first detection circuit according to the first exemplary embodiment.

FIG. 6 is a circuit diagram showing a configuration example of a first detection circuit according to the present exemplary embodiment. With reference to FIG. 6, each unit pixel has, in addition to APD 601 and charge storage part 602, reset transistor RT, selection transistor SL, amplifier transistor SF, and current load transistor LG. Amplifier transistor SF and current load transistor LG constitute source follower type amplifier 50 which detects the signal charge by converting the signal charge into a voltage.

In the circuit shown in FIG. 6, when light enters APD 601, a charge is generated inside APD 601, and a signal charge corresponding to the charge is accumulated in charge storage part 602. The signal charge is amplified by source follower type amplifier 50 and is output.

Current load transistor LG is disposed in the pixel according to FIG. 6; however, current load transistor LG may be connected to an end of column signal lines 64 outside the pixel.

Figure 7:
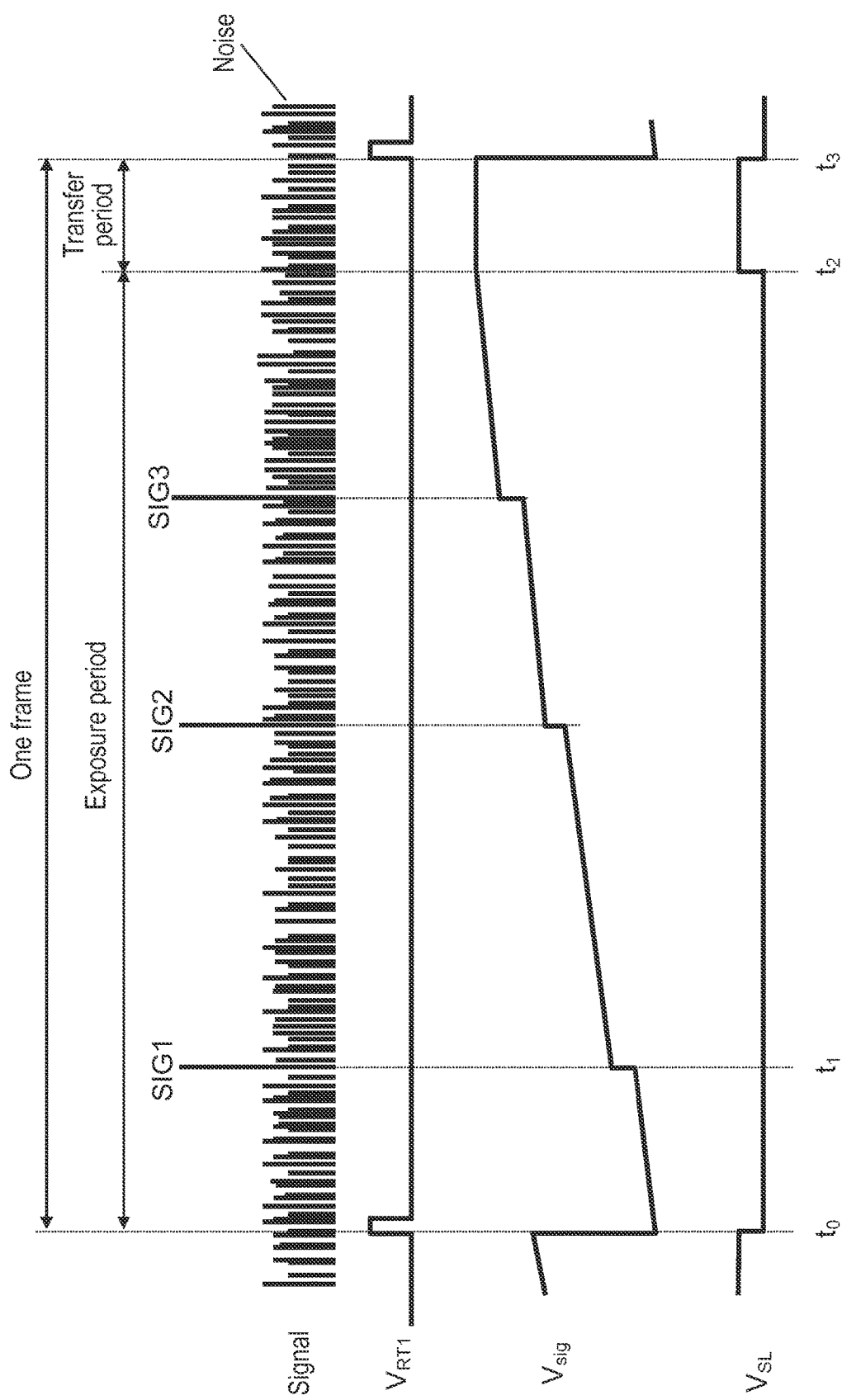
FIG. 7 is a timing chart of the first detection circuit according to the first exemplary embodiment.

Next, an operation of the circuit diagram of FIG. 6 will be described with reference to the circuit diagram of FIG. 6 and a timing chart of FIG. 7.

First at time $t_0$, control signal $V_{RT1}$ becomes a high level to set reset transistor RT in an on-state. By this operation, a charge in charge storage part 602 is discharged to power supply voltage $V_{dd}$ and is thus reset. At this time, $V_{SL}$ becomes a low level to put selection transistor SL in an off-state. Time $t_0$ is a start time of one frame.

During an exposure period from time $t_0$ to time $t_2$, when a charge is generated by causes other than incidence of photon, a charge of a noise component is accumulated in charge storage part 602; thus, the voltage change amount $V_C$ and output signal Vsig from amplifier 50 slightly increases upon the incidence. During the exposure period from time $t_0$ to time $t_2$, when a photon enters at time $t_1$ to generate signal SIG 1, the stored charge in charge storage part 602 momentarily increases; therefore, the voltage change amount $V_C$ and output signal Vsig also increase. The timing chart of FIG. 7 shows an example in which photons further enter twice in the one frame to generate signal SIG2 and signal SIG3.

Next, at time t2, $V_{SL}$ turns to a high level to put selection transistor SL in an on-state so that the voltage change amount $V_C$ due to the signal charge stored in charge storage part 602 is read out to column signal lines 64 as output signal Vsig by amplifier 50 constituted of amplifier transistor SF and load transistor LG.

Then, at time t3, $V_{SL}$ turns to a low level to put selection transistor SL in an off-state, and control signal $V_{RT1}$ turns to a high level to put reset transistor RT in an on-state so that voltage change amount $V_C$ is reset. The above operation completes the period of one frame.

In the present exemplary embodiment, it is possible to form a detection circuit having a high charge-voltage conversion factor by using a charge storage part with a small storage capacitance; therefore, it is not necessary to apply an extremely high voltage to APD 601 to increase the multiplication factor. In the present exemplary embodiment, the voltage applied to APD 601 is set slightly lower than the breakdown voltage VBD of APD 601 so that APD 601 operates in the linear mode. In this case, the dark noise and the multiplication noise of APD 601 can be largely reduced compared to the case of operation in the Geiger mode, whereby the S/N ratio is improved.

Figure 8:
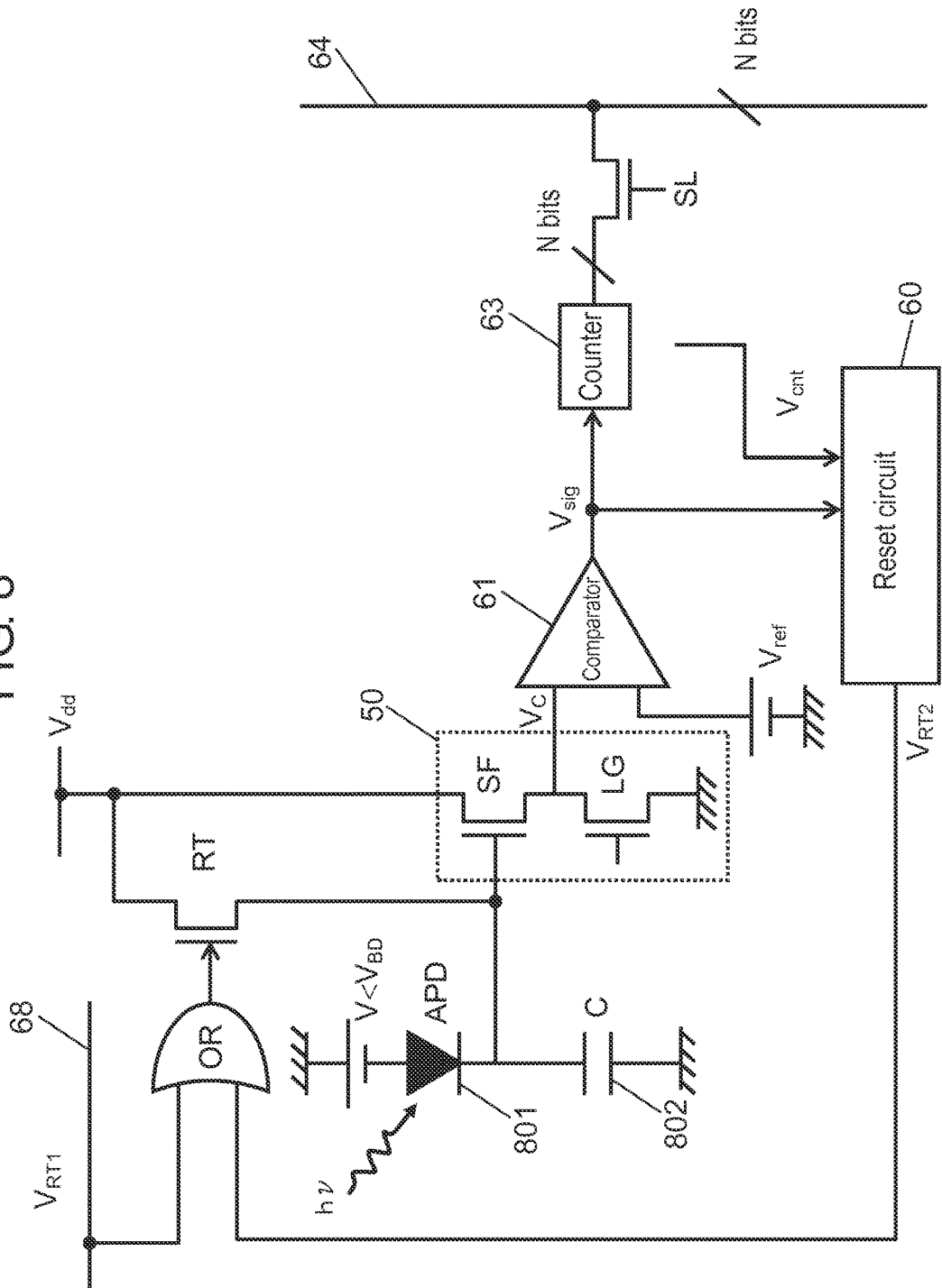
FIG. 8 is a circuit diagram showing a configuration example of a second detection circuit according to the first exemplary embodiment.

Next, with reference to FIG. 8 to FIG. 11, there will be described a configuration example of a second detection circuit according to the present exemplary embodiment. FIG. 8 is a circuit diagram showing the configuration example of the second detection circuit. With reference to FIG. 8, each unit pixel has APD 801, charge storage part 802, reset transistor RT, one or a plurality of selection transistors SL, amplifier transistor SF, current load transistor LG, reset circuit 60, comparator 61, and counter 63.

Amplifier transistor SF and current load transistor LG constitute source follower type amplifier 50 which detects the signal charge by converting the signal charge into a voltage. Reset transistor RT and reset circuit 60 which generates a reset signal for discharging the charge stored in charge storage part 802 constitute a noise suppression circuit.

Comparator 61 sets a threshold for an output value from charge storage part 802. Counter 63 is disposed in a rear stage of comparator 61 to count the output value from comparator 61.

With the above configuration, the noise suppression circuit can remove a noise charge generated by causes other than incidence of a photon, for example, thermal excitation, whereby the S/N ratio can be improved. Further, because comparator 61 and counter 63 are provided in a rear stage of amplifier 50, the output value from comparator 61 can be counted by counter 63 as a digital value.

An OR circuit is connected to a gate of reset transistor RT. The OR circuit drives reset transistor RT when either of control signal $V_{RT2}$ from reset circuit 60 or control signal $V_{RT1}$ from reset control line 68 is input. Reset circuit 60 stops, upon detecting signal $V_{sig}$ from comparator 61, outputting control signal $V_{RT2}$ to interrupt a reset operation of reset transistor RT. Alternatively, reset circuit 60 can be controlled using not the signal from comparator 61 but a signal of counter 63. An output signal of n bits from counter 63 is output through one or a plurality of selection transistors SL to column signal lines 64. Column signal lines 64 are connected to the every unit pixel arranged in the same column.

Alternatively, another method may be used in which the n bit output signal of counter 63 of each pixel is generated by using a shift register.

Counter 63 is disposed in the pixel according to FIG. 8; however, counter 63 may be connected to an end of column signal lines 64 outside the pixel.

Figure 9:
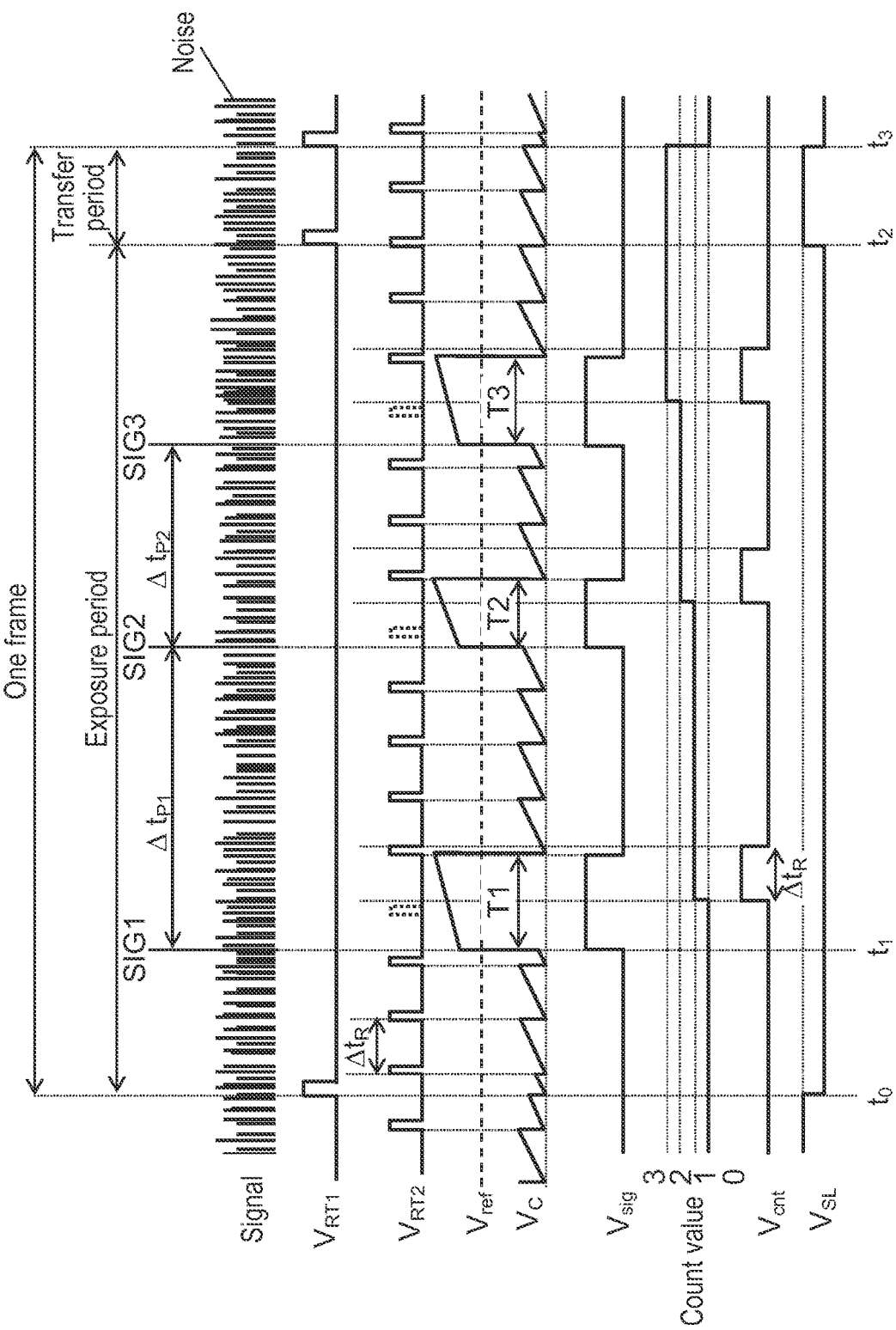
FIG. 9 is a timing chart of the second detection circuit according to the first exemplary embodiment.

Next, an operation of the circuit diagram of FIG. 8 will be described with reference to the circuit diagram of FIG. 8 and a timing chart of FIG. 9.

Reset circuit 60 outputs a pulse signal at time intervals $\Delta t_R$ which are appropriately set to be shorter than typical incidence intervals $\Delta t_{P1}$ and $\Delta t_{P2}$ of photons to be detected. The time interval $\Delta t_R$ is set so that the output value due to the noise charge stored in charge storage part 802 is not larger than the threshold set on comparator 61. In this case, in the period when reset circuit 60 does not receive the signal from comparator 61, reset circuit 60 repeatedly outputs the reset pulse signals to reset transistor RT at the time intervals $\Delta t_R$. This operation periodically discharges the charge which is accumulated in charge storage part 802 and is generated by causes other than incidence of photon.

First, at time $t_0$, control signal $V_{RT1}$ turns to a high level to put reset transistor RT in an on-state (first reset operation). At this time, $V_{SL}$ turns to a low level to put selection transistor SL in an off-state. Time $t_0$ is a start time of one frame. In the period when no photon enters, control signal $V_{RT2}$ from reset circuit 60 periodically turns to a high level to periodically discharge the charge stored in charge storage part 802 (second reset operation). That is, since charge storage part 802 is repeatedly reset by the second reset operation in the period when signal $V_{sig}$ from comparator 61 is not received, a noise charge accumulated due to the dark current or the like is periodically discharged, whereby the S/N ratio can be improved. As a result, it is not necessary to perform a process in which the S/N ratio is compensated in synchronism with a light source, which process is performed in the conventional art in which scan is performed by using a single photodetector, whereby it is also possible to realize accurate detection of random light.

Next, when a photon enters to generate signal SIG 1 at time $t_1$, the stored charge in charge storage part 802 momentarily increases, whereby the voltage change amount $V_C$ also increases. When the value of $V_C$ exceeds a threshold $V_{ref}$, comparator 61 outputs a predetermined voltage signal $V_{sig}$.

During reception of signal $V_{sig}$ from comparator 61, reset circuit 60 stops, for period T1, control signal $V_{RT2}$ having been periodically output so as to stop discharging of the charge stored in charge storage part 802. During the period T1, counter 63 counts signal $V_{sig}$ from comparator 61. Along with the counting, reset circuit 60 receives signal $V_{cnt}$ from counter 63 for the period $\Delta t_R$. Reset circuit 60 is designed to resume outputting control signal $V_{RT2}$ upon simultaneous reception of signal $V_{sig}$ and signal $V_{cnt}$ from comparator 61. Thus, reset transistor RT resumes discharging the charge stored in charge storage capacitor C in this period $\Delta t_R$.

The above operation is repeated during the exposure period of one frame. The timing chart of FIG. 9 according to the present exemplary embodiment shows an example in which photons further enter twice in the one frame to generate signal SIG2 and signal SIG3.

Next, $V_{SL}$ turns to a high level at time $t_2$ to put selection transistor SL in an on-state so that a digital signal output from counter 63 is transferred to column signal lines 64. At this time, control signal $V_{RT1}$ may turn to a high level as shown in FIG. 9 to turn reset transistor RT on, or control signal $V_{RT1}$ may maintain a low level.

A count reset circuit (not shown) is connected to counter 63, and the voltage of the counter is initialized at time t3. In addition, at time $t_3$, selection transistor SL returns to the off-state. Accordingly, the period of one frame is completed. At this time, control signal $V_{RT1}$ turns to a high level to turn also reset transistor RT on. Then, the next period of one frame starts.

As described above, the first reset operation and the second reset operation are performed in the configuration example of the second detection circuit according to the present exemplary embodiment. In the first reset operation, charge storage part 802 is reset at the same time of completion of a first period (transfer period: time $t_2$ to time $t_3$) in which an output signal from amplifier 50 is read out. In the second reset operation, charge storage part 802 is repeatedly reset at intervals shorter than the first period, but the repeated resetting is suspended for a predetermined period after a photon enters.

With this configuration, charge storage part 802 is repeatedly reset while the signal charge is not generated; therefore, a charge generated by causes other than incidence of photon is prevented from being accumulated.

Note that, in semiconductor photodetector 100, reset circuit 60 may stop outputting the pulse signal to reset transistor RT during reception of the signal from comparator 61. With this configuration, it is prevented that the signal charge is reset before the output value from comparator 61 is counted by counter 63.

In semiconductor photodetector 100, reset circuit 60 may start to output control signal $V_{RT2}$ to reset transistor RT at the same time when receiving signal $V_{cnt}$ from counter 63. With this configuration, the second reset operation can be resumed sooner.

Figure 10:
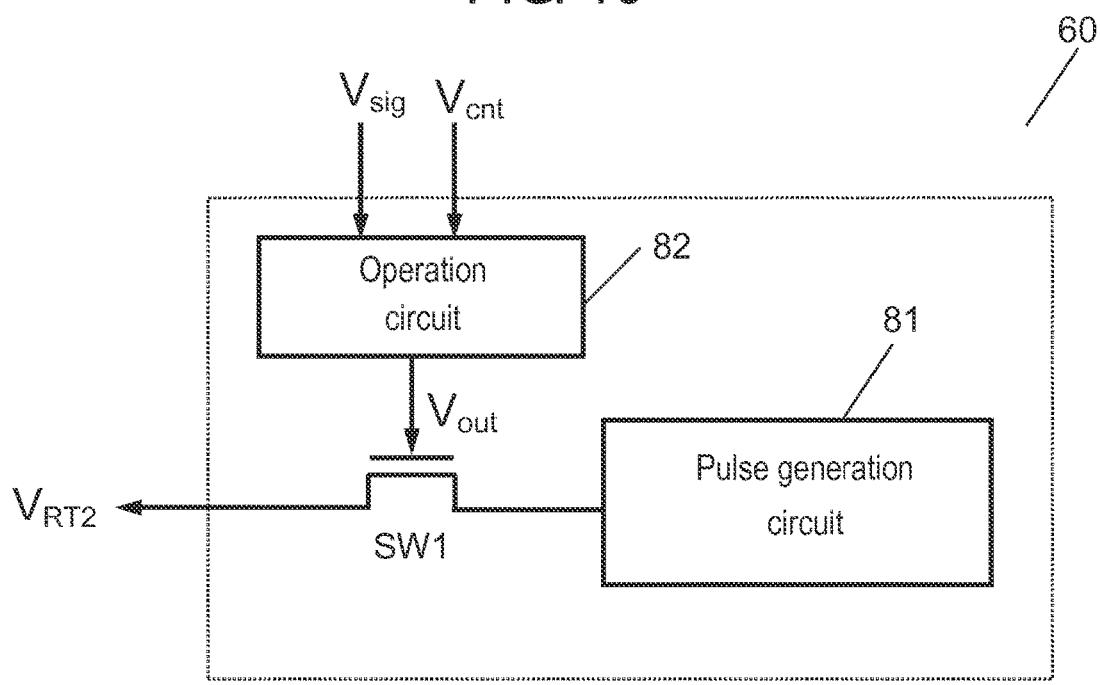
FIG. 10 is a configuration diagram of a reset circuit according to the first exemplary embodiment.

FIG. 10 is a configuration diagram of reset circuit 60 according to the present exemplary embodiment. Reset circuit 60 has pulse generation circuit 81, operation circuit 82, and control transistor SW1. Pulse generation circuit 81 generates pulse signals. Operation circuit 82 calculates a time period in which pulse signal is output from pulse generation circuit 81. Control transistor SW1 is supplied with an output value $V_{out}$ from operation circuit 82 as an input voltage. Operation circuit 82 is supplied with output signal $V_{sig}$ from comparator 61 and output signal $V_{ent}$ from counter 63 as inputs, and operation circuit 82 outputs the calculation result to control transistor SW1 as the output value $V_{out}$.

Figure 11:
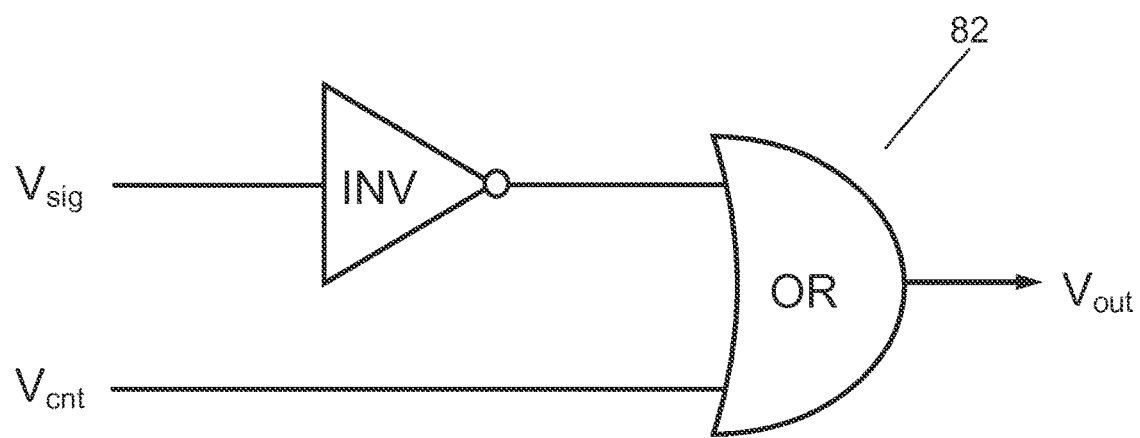
FIG. 11 is a logic circuit diagram of an operation circuit according to the first exemplary embodiment.

FIG. 11 is a logic circuit diagram of operation circuit 82. With $V_{sig}$ and $V_{ent}$ being used as two input values, an INV (inverter) circuit and an OR circuit are connected as shown in FIG. 11.

With this configuration, in the period when none of signal $V_{sig}$ from comparator 61 and signal $V_{ent}$ from counter 63 is received, in other words, in the period when light does not enter, control transistor SW1 is in an on-state, whereby control signal $V_{RT2}$ generated in pulse generation circuit 81 is repeatedly output to reset transistor RT in pulse form.

Next, if signal $V_{sig}$ from comparator 61 is received in the state that no signal $V_{ent}$ is received from counter 63, control transistor SW1 turns to an off-state, whereby the output of control signal $V_{RT2}$ from reset circuit 60 is suspended.

Subsequently, if signal $V_{ent}$ is received from counter 63 in the state that signal $V_{sig}$ has been received from comparator 61, control transistor SW1 turns again to an on-state, whereby the output of control signal $V_{RT2}$ from reset circuit 60 is resumed.

According to FIG. 8, source follower type amplifier 50 is disposed as the detection circuit; however, if amplifier 50 is replaced by an inverter type detection circuit, a detection circuit can be configured to have also the function of comparator 61 in the rear stage.

Next, with reference to FIG. 12A to FIG. 12I, there will be described an example of a method for manufacturing the photodetector according to the present exemplary embodiment. In the manufacturing method shown in FIG. 12A to FIG. 12I, an SOI (Silicon on Insulator) substrate is used to manufacture the semiconductor photodetector according to the present exemplary embodiment.

Figure 12A:
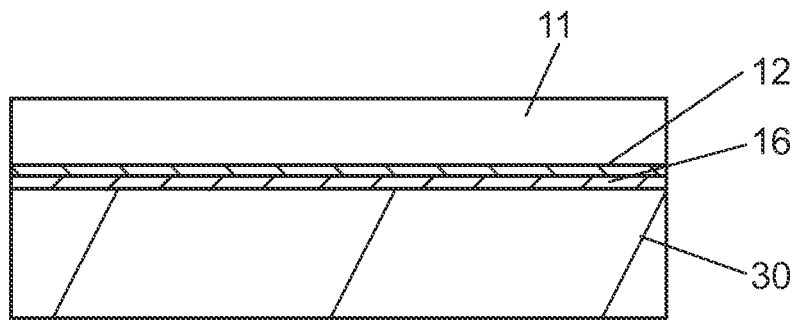
FIG. 12A is a process cross-sectional view of a method for manufacturing the semiconductor photodetector according to the first exemplary embodiment.

First, as shown in FIG. 12A, an SOI substrate is prepared which has silicon base substrate 30, protective oxide film 16, first semiconductor part 12, and semiconductor layer 11, which is a silicon epitaxial growth layer.

Figure 12B:
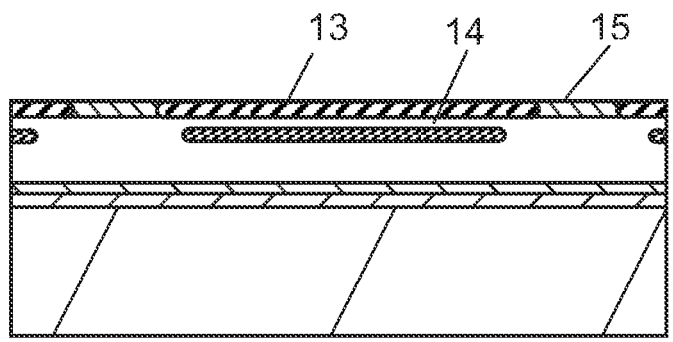
FIG. 12B is a process cross-sectional view of the method for manufacturing the semiconductor photodetector according to the first exemplary embodiment.

Next, as shown in FIG. 12B, an ion implantation process is used to form, in semiconductor layer 11, second semiconductor part 13, third semiconductor part 14, and fourth semiconductor part 15. If an STI is formed as the pixel isolation region, a normal STI forming process may be applied to the part in which fourth semiconductor part 15 is formed.

Figure 12C:
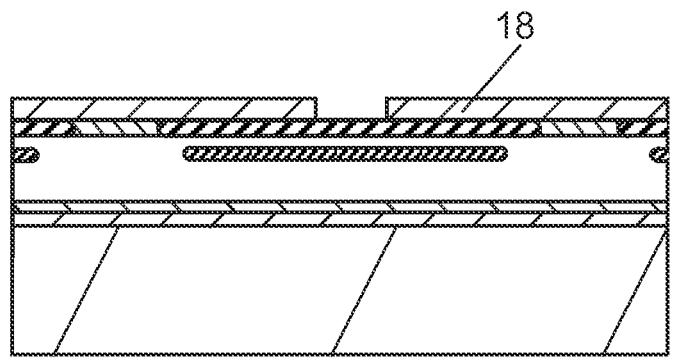
FIG. 12C is a process cross-sectional view of the method for manufacturing the semiconductor photodetector according to the first exemplary embodiment.

Next, as shown in FIG. 12C, interlayer insulating film 18 made of oxide is formed on a surface of semiconductor layer 11 opposite to silicon base substrate 30, and an opening is made in a part of interlayer insulating film 18 to form a contact hole.

Figure 12D:
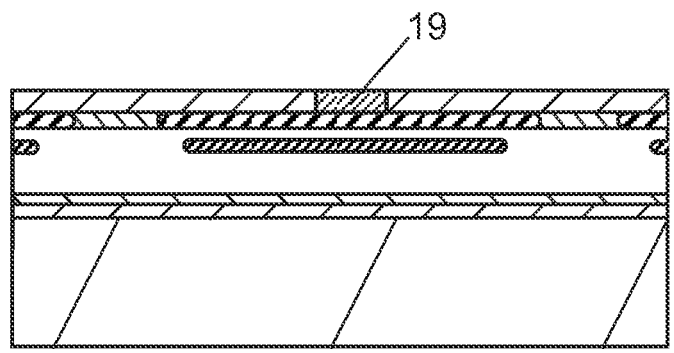
FIG. 12D is a process cross-sectional view of the method for manufacturing the semiconductor photodetector according to the first exemplary embodiment.

Next, as shown in FIG. 12D, contact plug 19 is formed so as to fill the contact hole.

Figure 12E:
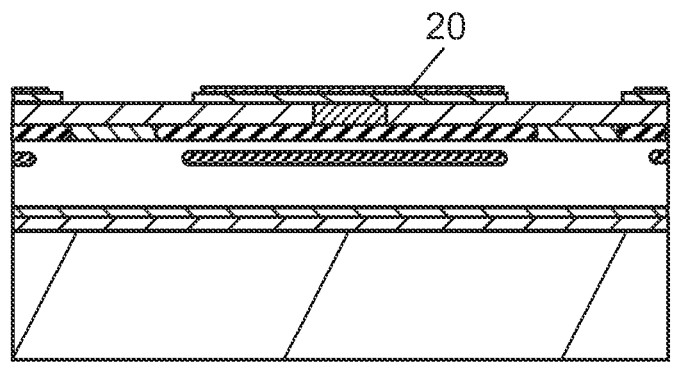
FIG. 12E is a process cross-sectional view of the method for manufacturing the semiconductor photodetector according to the first exemplary embodiment.

Next, as shown in FIG. 12E, first pixel electrode 20 is formed on the surface of interlayer insulating film 18 so as to cover contact plug 19.

Figure 12F:
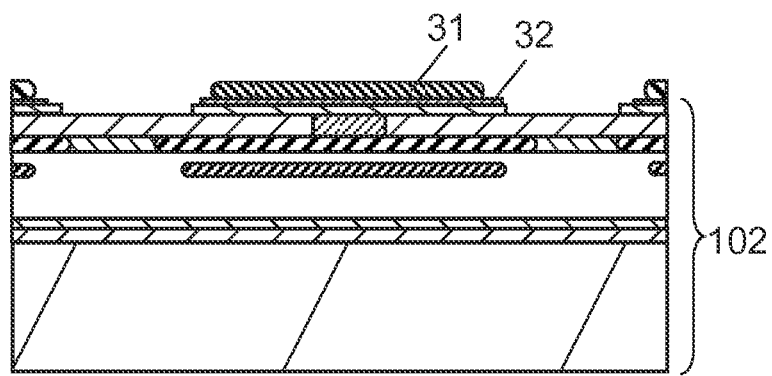
FIG. 12F is a process cross-sectional view of the method for manufacturing the semiconductor photodetector according to the first exemplary embodiment.

Next, as shown in FIG. 12F, bonding base metal 32 and bonding bump metal 31 are formed on pixel electrode 20.

Figure 12G:
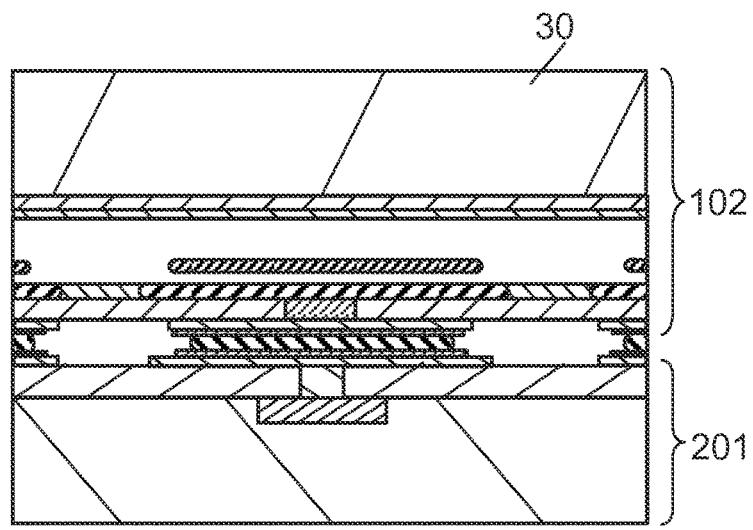
FIG. 12G is a process cross-sectional view of the method for manufacturing the semiconductor photodetector according to the first exemplary embodiment.

Next, as shown in FIG. 12G, substrate 102 including photoelectric conversion part 101 and detection circuit 201 are bonded.

Figure 12H:
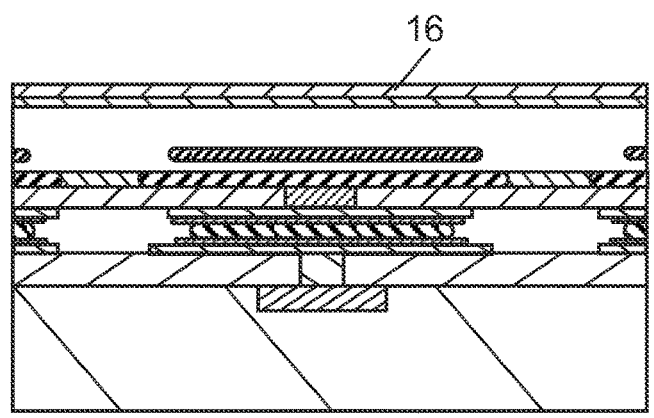
FIG. 12H is a process cross-sectional view of the method for manufacturing the semiconductor photodetector according to the first exemplary embodiment.

Next, as shown in FIG. 12H, silicon base substrate 30 is removed so that protective oxide film 16 is exposed. In this step, since protective oxide film 16 functions as an etching stop layer, silicon base substrate 30 is easily removed.

Figure 12I:
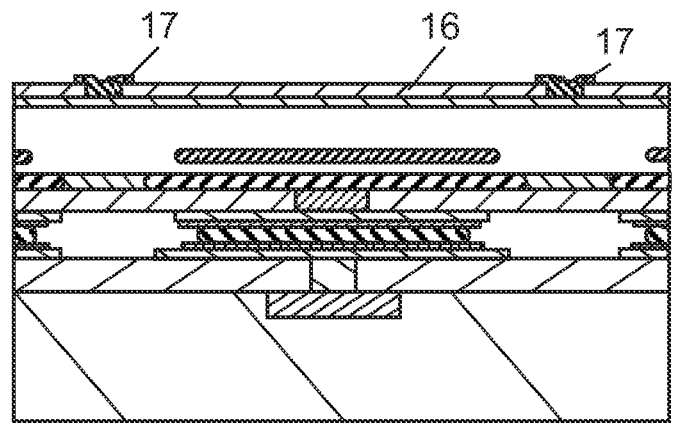
FIG. 12I is a process cross-sectional view of the method for manufacturing the semiconductor photodetector according to the first exemplary embodiment.

Finally, as shown in FIG. 12I, openings are made in parts of protective oxide film 16, and electrode 17 is formed in an area in which first semiconductor part 12 is exposed.

In the method for manufacturing semiconductor photodetector 100 according to the present exemplary embodiment, because protective oxide film 16 servings as an etching stop layer is included, it is not necessary to use a complicated etching process. Therefore, it is easy to manufacture a lamination type photodetector in which a photoelectric conversion part and a detection circuit are laminated. In addition, semiconductor photodetector 100 can be manufactured only by a wet etching process without using a dry etching process; thus, semiconductor photodetector 100 is less damaged.

Second Exemplary Embodiment

Figure 13:
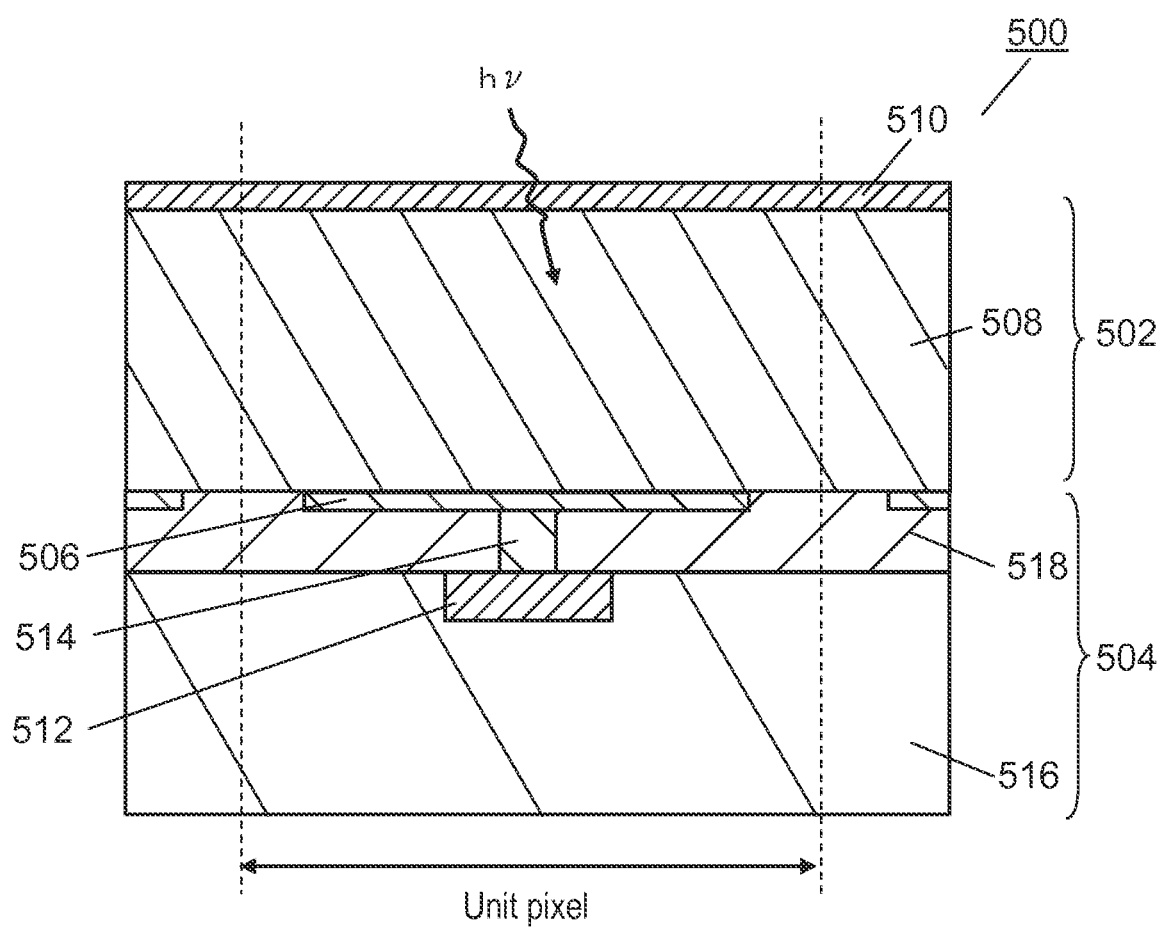
FIG. 13 is a sectional view of a unit pixel of a semiconductor photodetector according to a second exemplary embodiment of a present disclosure.
Figure 14:
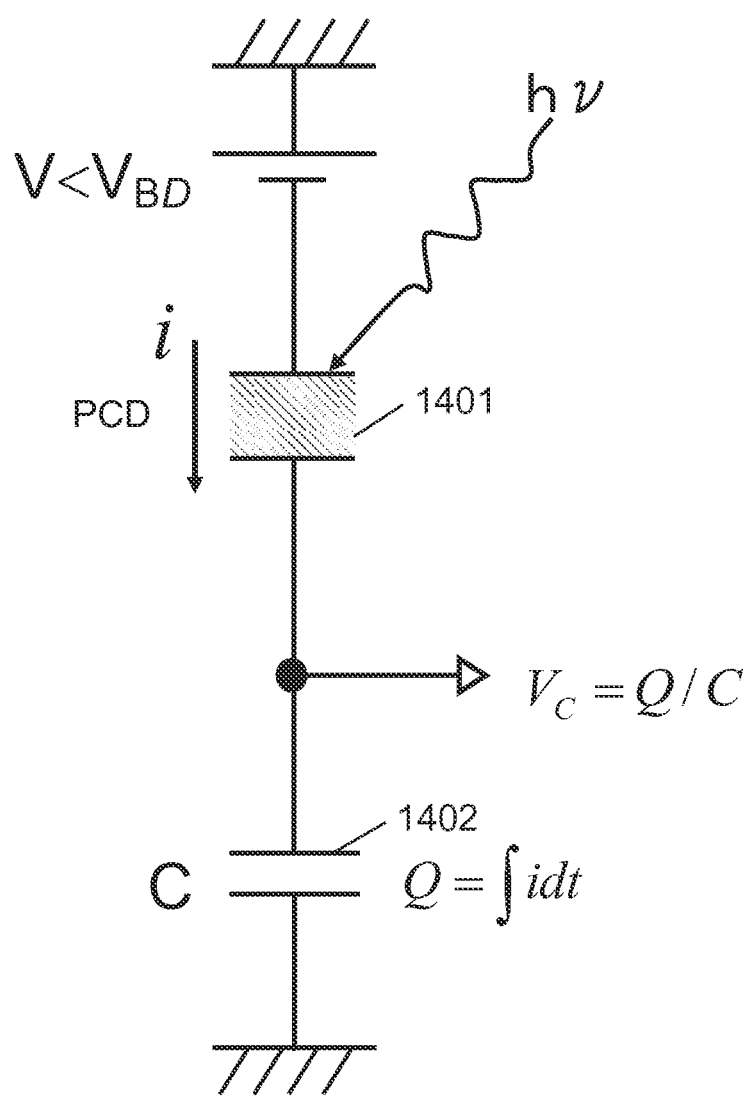
FIG. 14 is a diagram showing an equivalent circuit of the semiconductor photodetector according to the second exemplary embodiment.

With reference to FIG. 13 and FIG. 14, there will be described a structure of a unit pixel of semiconductor photodetector 500 according to a second exemplary embodiment of the present disclosure.

Semiconductor photodetector 500 according to the present exemplary embodiment is provided, in a matrix, with a plurality of unit pixels on semiconductor substrate 516. Each of the plurality of unit pixels has photoelectric conversion part 502 and detection circuit 504; and photoelectric conversion part 502 and detection circuit 504 are electrically connected through pixel electrode 506 and contact plug 514.

Photoelectric conversion part 502 is constituted of semiconductor part 508 made of a photoconductive material. Electrode 510 is formed on a surface of semiconductor part 508, where incident light enters.

Examples of the photoconductive material include a semiconductor containing Se, a compound semiconductor $CuIn_xGa_{1-x}S_ySe_{1-y}$ (where $0 \le x \le 1$ and $0 \le y \le 1$), and group III-V compound semiconductors. In these photoconductive materials, avalanche multiplication is caused by application of a predetermined voltage determined by composition and a film thickness of these photoconductive materials. For example, if photoconductive material 508 is amorphous Se and the thickness is 2 μm, application of a voltage of approximately 300 V to photoconductive material 508 causes avalanche multiplication inside photoconductive material 508.

Electrode 510 may be disposed on a surface of semiconductor part 508, where incident light enters, in a grid-like manner or on the entire surface. When electrode 510 is disposed on entire surface, electrode 510 is preferably made of a transparent conductive film which transfers incident light. As material for electrode 510, a material similar to the material in the first exemplary embodiment may be used.

Detection circuit 504 has semiconductor substrate 516 and charge storage part 512 formed in semiconductor substrate 516. Interlayer insulating film 518 is disposed between photoelectric conversion part 502 and detection circuit 504.

FIG. 14 is an equivalent circuit diagram of semiconductor photodetector 500 according to the second exemplary embodiment. PCD (Photoconductive diode, hereinafter referred to as PCD) 1401 and charge storage part 1402 of FIG. 14 are photoelectric conversion part 502 made of photoconductive material and charge storage part 512 of FIG. 13, respectively.

When light enters PCD 1401 of FIG. 14, a signal charge is generated inside PCD 1401, a multiplication current i flows in accordance with the signal charge. In a capacitor, there is accumulated a charge $Q=\int i dt$. The stored charge is detected as a voltage change amount $V_c=Q/C$ expressed by a capacitance C of the capacitor. When a charge storage part having the small capacitance C is fabricated by a microfabrication technique, the voltage change amount $V_c$ can be made large.

In the method for manufacturing semiconductor photodetector 500 of FIG. 13, there may be formed, on semiconductor substrate 516, charge storage part 512, interlayer insulating film 518, pixel electrode 506, semiconductor part 508, and electrode 510, in this order.

According to the present exemplary embodiment, a photoelectric conversion part can be made without using a p-n junction; thus, a dark current due to exposure of a p-n junction interface is reduced.

INDUSTRIAL APPLICABILITY

A photodetector according to the present disclosure is effective for a light detection device which detects very weak light of a light emission phenomenon such as radiation detection.

What is claimed is:

1. A semiconductor photodetector comprising:
   at least one unit pixel including:
      a photoelectric conversion part having a charge multiplication region in which incident light is converted into a charge and the charge is multiplied by avalanche multiplication;
      a charge storage part connected to the photoelectric conversion part and configured to store a signal charge from the photoelectric conversion part; and
      a detection circuit connected to the charge storage part, configured to convert the signal charge stored in the charge storage part into a voltage, and configured to pass the voltage through an amplifier to amplify the voltage and output the amplified voltage,
   wherein the photoelectric conversion part includes:
   a semiconductor layer having a first surface located on a place where incident light enters and a second surface opposite to the first surface;
   a first semiconductor part formed on the first surface of the semiconductor layer;
   a second semiconductor part formed on a part of the second surface of the semiconductor layer;
   a third semiconductor part formed inside the semiconductor layer and at a position which overlaps, in a plan view, the second semiconductor part;
   a fourth semiconductor part formed on the second surface of the semiconductor layer and in an area in which the second semiconductor part is not formed, the fourth semiconductor part having at least one of an impurity concentration different from that of the second semiconductor part and a conductive type different from that of the second semiconductor part;
   a first electrode disposed on the first surface of the semiconductor layer, and electrically connected to the first semiconductor part; and
   a second electrode disposed on the second surface of the semiconductor layer, and electrically connected to the second semiconductor part, and wherein the semiconductor layer, the first semiconductor part, and third semiconductor part are of a first conductive type,
   the second semiconductor part and the fourth semiconductor part are of a second conductive type different from the first conductive type, and
   the second semiconductor part has the impurity concentration higher than the impurity concentration of the fourth semiconductor part.

2. The semiconductor photodetector of claim 1, comprising a plurality of the unit pixels arranged in a matrix.

3. The semiconductor photodetector of claim 1, wherein the charge which causes the avalanche multiplication is any one of an electron and a hole.

4. The semiconductor photodetector of claim 1, wherein the avalanche multiplication caused in the photoelectric conversion part operates in a linear mode.

5. The semiconductor photodetector of claim 1, wherein the photoelectric conversion part is provided in a layer different from a layer in which the detection circuit is provided.

6. The semiconductor photodetector of claim 1, wherein the impurity concentration of the second semiconductor part is not lower than 10 times and not higher than $10^4$ times of the impurity concentration of the fourth semiconductor part.

7. The semiconductor photodetector of claim 1, wherein the third semiconductor part is disposed not to overlap, in a plan view, the fourth semiconductor part.

8. The semiconductor photodetector of claim 1, wherein the third semiconductor part has an impurity concentration higher than an impurity concentration of the semiconductor layer.

9. The semiconductor photodetector of claim 1, wherein the semiconductor layer is made of a silicon epitaxial growth layer.

10. The semiconductor photodetector of claim 1, further comprising:
    a noise suppression circuit connected to the charge storage part and configured to reduce noise generated in the charge storage part.

11. The semiconductor photodetector of claim 10, wherein the noise suppression circuit comprises:
    a reset transistor connected to the amplifier so as to reset the charge storage part; and
    a reset circuit configured to output a reset pulse signal to the reset transistor.

12. The semiconductor photodetector of claim 11, further comprising, in a rear stage of the amplifier:
    a comparator; and
    a counter.

13. The semiconductor photodetector of claim 12, wherein the reset circuit carries out a reset action based on an output signal of the comparator.

14. The semiconductor photodetector of claim 11, wherein the semiconductor photodetector performs:
    an first reset operation in which an output signal from the amplifier is read out in a first period, and the charge storage part is reset at the same time at which the first period ends; and
    a second reset operation in which the charge storage part is repeatedly reset at intervals shorter than the first period, and the repeated reset is halted for a predetermined period after a photon enters.

15. The semiconductor photodetector of claim 12, wherein the reset circuit repeatedly outputs the reset pulse signal to the reset transistor in a period when the reset circuit does not receive the signal from the comparator.

16. The semiconductor photodetector of claim 12, wherein the reset circuit stops outputting the reset pulse signal to the reset transistor in a period when the reset circuit receives the signal from the comparator.

17. The semiconductor photodetector of claim 12, wherein the reset circuit starts to output the reset pulse signal to the reset transistor at the same time when the reset circuit receives the signal from the counter.

\* \* \* \* \*